United States Patent [19]

Canter

[11] Patent Number: 5,130,539
[45] Date of Patent: Jul. 14, 1992

[54] IMAGING BETA TRACER MICROSCOPE

[75] Inventor: Karl F. Canter, Lexington, Mass.

[73] Assignee: Brandeis University, Waltham, Mass.

[21] Appl. No.: 685,299

[22] Filed: Apr. 12, 1991

[51] Int. Cl.$^5$ ............................................ G01N 23/00
[52] U.S. Cl. ................................ 250/306; 250/307;
250/308; 250/440.11
[58] Field of Search ............ 250/306, 307, 308, 440.1,
250/358.1

[56] References Cited

U.S. PATENT DOCUMENTS

| 3,439,166 | 4/1969 | Chore | 250/358.1 |
|---|---|---|---|
| 3,711,707 | 1/1973 | Lilienfeld et al. | 250/43.5 |
| 3,742,216 | 6/1973 | Hahn | 250/83.3 |
| 3,824,395 | 7/1974 | Fries et al. | 250/308 |
| 3,899,878 | 8/1975 | Compton et al. | 60/39.28 |
| 4,024,394 | 5/1977 | Reuland | 250/308 |
| 4,156,139 | 5/1979 | Bingo et al. | 250/308 |
| 4,293,767 | 10/1981 | Fischer et al. | 250/308 |
| 4,506,541 | 3/1985 | Cunningham | 73/32 |
| 4,574,194 | 3/1986 | Coats et al. | 250/308 |
| 4,590,373 | 5/1986 | Barton et al. | 205/308 |

OTHER PUBLICATIONS

Rempfer, G. F., and Griffith, O. H., "The Resolution of Photoelectron Microscopes with UV, X-Ray, and Synchroton Excitation Sources", Ultramicroscopy 27, 273 (1989).
Nelms, Ann T., "Energy Loss and Range of Electrons and Positrons", National Bureau of Standards Circular 577 (1956).
Dekker, A. J., "Secondary Electron Emission", Solid State Physics, vol. 6, Seitz, F., and Turnbull, D., eds., Academic Press, pp. 251-311 (1958).
Whetten, N. R., and Laponsky, A. B., "Secondary Electron Emission of Single Crystals of MgO", J. Appl. Phys. 28, 515 (1957).
Heidenreich, R. D., "Thermionic Emission Microscopy of Metals, Part I. General", J. Appl. Phys. 26, 757 (1955).
Brandes, G. R., Center, K. F., Horsky, T. N., and Mills, Jr., A. P., "Demonstration of Positron Re-Emission Microscopy Using an Immersion Objective", Appl. Phys. A46, 335 (1988).
Walter, L., "Thin Film Field Emission", Phys. Rev. vol. 50, p. 48 (1936).
Marton, L., ed., Methods of Experimental Physics, Academic Press, pp. 69-84 (1967).

(List continued on next page.)

Primary Examiner—Jack I. Berman
Assistant Examiner—Kiet T. Nguyen
Attorney, Agent, or Firm—Fish & Richardson

[57] ABSTRACT

Observing and detecting the spatial distribution of beta emissions by placing the specimen on a converter window, which converts the energetic beta particles to low energy, secondary electrons, which emerge from the opposite side of the window. The secondary electrons are then microscopically imaged by an emission microscope, preferably onto a position sensitive detector. The technique is able to achieve microscopic resolution with quantitative and rapid data acquisition. It is particularly suited to detecting the spatial distribution of specimens tagged with tritium. Preferably, the specimen is supported in proximity to the converter window (e.g., directly on one surface of the window); a position-sensitive detector is located at the imaging location; a support grid underlies and supports the converter window; the converter window is exposed to the vacuum of the emission microscope on one side and to a non-evacuated space on the other side; the thickness of the converter window is less than 10 microns and greater than 1 micron. Alternatively, a vacuum enclosure may surround the converter window so that the window has a vacuum on both sides. Preferably, the converter window is a multilayer structure comprising a first layer (e.g., a polycrystalline material such as titanium) capable of moderating beta particles to facilitate secondary electron conversion and a second layer (e.g., polymerized film) adhered to the first layer and serving to prevent gas leakage through said window from the unevacuated side to the evacuated side.

23 Claims, 1 Drawing Sheet

OTHER PUBLICATIONS

Bruining, H., "Physics and Applications of Secondary Electron Emission", McGraw-Hill, pp. 48-63 and 159-177 (1954).

Grantham, C., "Bacterial Identification System is Fully Automated", Laboratory Equipment Digest (GB), vol. 22, No. 10, pp. 84-85 (Oct. 1984).

Koller, Lewis R., and Johnson, R. P., "Visual Observations on the Malter Effect", Physical Review, vol. 52, pp. 519-523 (1937).

Hasselbach, F., and Krauss, H. R., "Backscattered Electrons and Their Influence on Contrast in the Scanning Electron Microscope", Scanning Microscopy, vol. 2, No. 4, pp. 1947-1956 (1988).

IMAGING BETA TRACER MICROSCOPE

BACKGROUND OF THE INVENTION

This invention relates to microscopic imaging of beta particle emissions.

The introduction of a beta emitting radioisotope into a specimen and the observation of how the isotope is subsequently spatially distributed in the specimen serves as a powerful research methodology in biomedical and biochemical research. Presently available methods of observing the radioisotope spatial distribution (RSD) fall principally into two categories: (1) direct detection of the betas (high energy electrons or positrons emitted from the radioisotope nucleus) with spatially sensitive detectors such as proportional wire chambers, scintillators, etc.; (2) beta detection with photographic-like emulsions placed in close proximity to the specimen. Direct detection methods have the desirable features of typically 10% efficiency and digitally acquired quantitative images of the RSD, but are restricted to spatial resolutions of 1 mm at best. Emulsion techniques are capable of 1-10 micron resolutions, but at an efficiency of 1% or less. The RSD image obtained in this manner typically requires a month exposure time and only results in a visual record of limited quantitative value. When the beta emitting isotope is tritium, the energy of the emitted beta particles is low, making it particularly difficult to produce an RSD image.

SUMMARY OF THE INVENTION

The invention takes a fundamentally different approach to observing and detecting the spatial distribution of beta emissions. The specimen is placed on a converter window, which converts the energetic beta particles to low energy, secondary electrons, which emerge from the opposite side of the window. The secondary electrons are then microscopically imaged by an emission microscope, preferably onto a position sensitive detector. The invention is able to achieve microscopic resolution with quantitative and rapid data acquisition. It is particularly suited to detecting the spatial distribution of specimens tagged with tritium.

In some preferred embodiments, the specimen is supported in proximity to the converter window (e.g., directly on one surface of the window); a position-sensitive detector is located at the imaging location; a support grid underlies and supports the converter window; the converter window is exposed to the vacuum of the emission microscope on one side and to a non-evacuated space on the other side; the thickness of the converter window is less than 10 microns and greater than 1 micron.

In other preferred embodiments, a vacuum enclosure surrounds the converter window so that the window has a vacuum on both sides; the thickness of the converter window is less than 1 micron, and most preferably between 0.1 and 0.05 microns.

Preferably, the converter window is a multilayer structure comprising a first layer (e.g., a polycrystalline material such as titanium) capable of moderating beta particles to facilitate secondary electron conversion and a second layer (e.g., polymerized film) adhered to the first layer and serving to prevent gas leakage through said window from the unevacuated side to the evacuated side.

Other features of the invention will be apparent from the following description of preferred embodiments, and from the claims.

DESCRIPTION OF PREFERRED EMBODIMENTS

Figure 1:
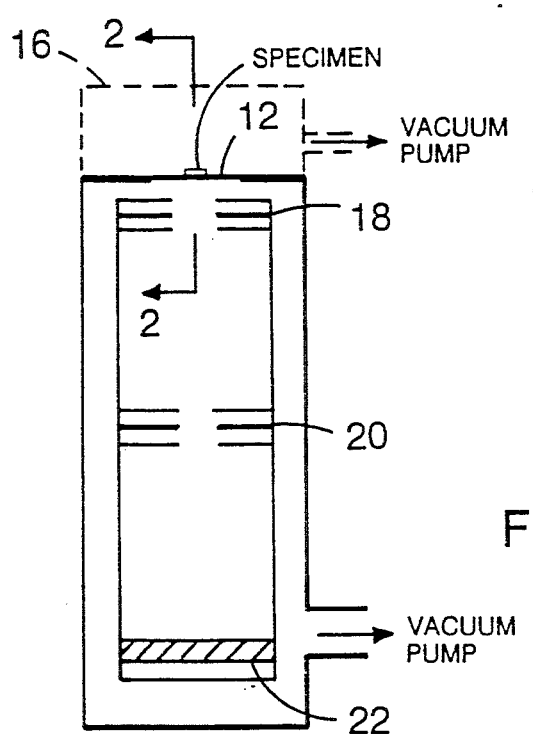
FIG. 1 is a cross-sectional, diagrammatic view of a preferred embodiment of the invention.
Figure 2:
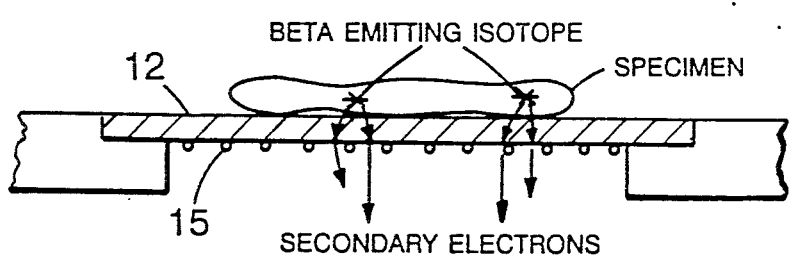
FIG. 2 is a cross-sectional, diagrammatic view taken along 2—2 in FIG. 1, showing the specimen mounted on the converter window.

Referring to FIGS. 1 and 2, a specimen that has been processed with beta-emitting isotopes is placed on converter window 12 positioned at one end of microscope 10.

The convertor window may be produced by standard thin film deposition techniques. A typical convertor window, for example, would be a 1 micron thick titanium self supporting foil with a 0.1 micron Parylene backing, followed by an optional 0.1 micron magnesium oxide coating. The titanium side would be the air side of the window for the specimen-in-air mode of operation. For the specimen-in-vacuum mode the convertor window would preferably be a 0.1 micron thick titanium, copper, aluminum, or other inexpensively produced thin polycrystaline films supported on a fine grid. (In the specimen-in-vacuum mode, the converter "window" is not separating air from vacuum, and thus could be thought of as a specimen-supporting, "converter film".) In this mode of operation, the parylene coating would not be necessary since its role is to eliminate pinhole leaks that unavoidably occur in the production of thin (typically less than 10 microns) metal films. Parylene (a registered trade name of Union Carbide Corporation) is a polymerized form of parapolyxylene and can be applied to any metal film and is bakeable to 150 degrees Celsius. This baking capability also extends to the epoxy seal that is needed to seal the convertor window to a mounting ring, which in turn forms the seal against vacuum by means of standard compression gaskets, for the case of the specimen in air mode of operation. In this mode, titanium is the preferred material for the air side of the window, both for strength and for ease of cleaning with solvents. The high density of titanium enables the production of secondary electrons within a short distance and hence contributes to the high resolution of the invention.

The converter window may optionally be structurally supported by support grid 14 (FIG. 2). A typical support grid would be commercially available woven tungsten wire etched or electroformed meshes with 80% -90% transmissions. For the specimen-in-air mode the support grid would enable a 1 micron titanium converter window to withstand the atmosphere-vacuum pressure differential with an active diameter up to typically 3 cm, as opposed to 3 mm without the mesh. In addition to the support grid providing mechanical strength for the larger converter window size option, it would also result in a convenient coordinate grid recorded as part of the imaged RSD. For the specimen-in-vacuum mode, a much finer grid could be afforded which would both support the converter window, and also provide a coordinate grid in the imaged RSD.

For the specimen-in-air mode, the most preferable converter titanium window thickness would be less than 10 micron and more than 1 micron. For the specimen-in-vacuum mode, these thicknesses would also work, but taking advantage of the lack of an atmosphere-vacuum pressure differential would enable the use of metal films less than 1.0 micro in thickness, and most preferably ranging from 0.05 to 0.10 microns thick. The thinner films would result in submicron resolution and low energy beta imaging capabilities.

The specimen side of the converter window can be enclosed within an evacuated chamber 16, to reduce pressure loading on the converter window when desired. The vacuum enclosure also allows use of a thinner window (e.g., as thin as 0.05 micron), to improve resolution and to make the microscope sensitive to low energy beta particles (e.g., approximately 10 keV, such as produced by tritium).

The specimen area and converter window assembly may be also be cooled by conventional, closed-cycle refrigeration or liquid cryogens when the specimen must remain frozen, either for sectioning purposes or because of its exposure to a vacuum.

Energetic beta particles emitted by the specimen enter the top surface of the converter window 12, and cause low energy (e.g., 10 eV) secondary electrons to emerge from the lower surface of the window. Approximately 1-10% of the beta particles emitted by the specimen are converted into secondary electrons. The emission microscope is of conventional design, and uses objective lens 18 and projector lens 20 to image the secondary electrons onto detector 22.

The converter window performs three functions: (1) mechanical support of the specimen; (2) conversion of the high energy betas into secondary electrons; and (3) enabling the option of having the specimen in air, in which case the converter window acts as a vacuum window or seal separating the specimen area from the vacuum ($10^{-7}$ torr or better) in which the imaging optics must function. The beta-to-secondary electron conversion efficiency $f_{cw}$ of the converter window, defined here as the fraction of the betas striking the converter window and emerging into the vacuum side of the microscope as secondary electrons, depends on the converter window thickness, material, surface coating on the vacuum side, and the beta emission energy distribution.

The thickness of the converter window is not only a determining factor in the converter window efficiency; but is also the most important factor in determining the microscope's spatial resolution R. Briefly, R decreases monotonically with decreasing converter window thickness until a fundamental resolution limit, which is dictated by the specimen thickness, is reached. For example, a 1 micron thick sample placed on a 0.1 micron converter window would yield R approximately equal to 1 micron and roughly 3 microns for a 1 micron converter window. The former example would illustrate a typical situation when the microscope is using tritium as the beta emitter and with the specimen side evacuated in order to prevent rupture or excessive vacuum leaks from pinholes in the thin converter window. The 1 micron converter window, if made out of titanium, for example, could withstand atmospheric pressure on the specimen side over a large area, the size of which depends on whether or not a support grid is employed on the vacuum side of the converter window. The dependence of R on converter window thickness is discussed below.

When energetic electrons, i.e., beta particles, pass through a material they typically lose energy on the order of 1.5 to 15 Mev-cm$^2$/g for energies ranging from 1 MeV down to 10 keV, respectively. A. T. Nelms, "Energy Loss and Range of Electrons and Positrons", National Bureau of Standards Circular 577, p. 27 (1956). These figures are relatively material independent and the energy loss per actual distance of travel through a particular material can be obtained by multiplying the loss rate in MeV-cm$^2$ by the specific material's mass density in g/cm$^3$. In order to liberate a secondary electron with 100% probability, from a metal for t example, the beta particle must lose roughly 10 eV of its energy within the last 3 nm of the exit side of the converter window. A. J. dekker, Solid State Physics, Vol. 6, F. Seitz and D. turnbull, eds. (Academic Press, 1958), pp. 251-311. This is necessary for the energetic electrons produced as a result of excitation by the beta particle to escape from the converter window. As a result, $f_{cw}$ can range from 1% to 10% for a metal converter window with passivated oxide coatings on the vacuum side. N. R. Whetten and A. B. Laponsky, J. Appl. Phys. 28, 515 (1957). The principal barrier that a secondary electron must surmount in order to escape from the converter window is the electron work function of the converter window.

The spatial resolution R of the microscope is determined by several contributing factors. The geometric resolution $R_g$ is the predominant factor and provides a good estimate of the upper limit on the overall resolution achievable. R is loosely defined as the minimum separation between two point sources (here, beta sources) in the specimen that can be "resolved." Historically, it has been common practice to define R as the full-width-at-half-maximum obtained for a point source.

Figure 3A:
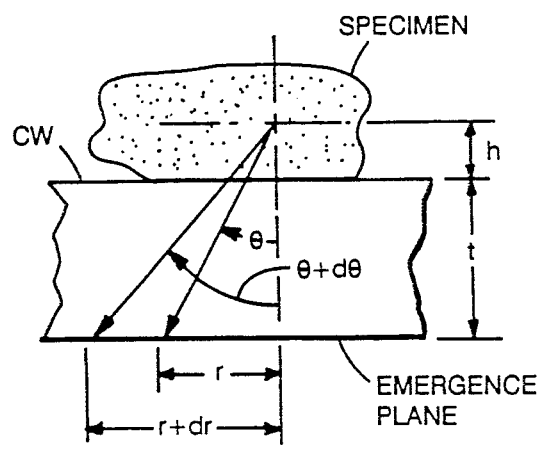
FIG. 3A is a cross-sectional, diagrammatic view of the specimen and converter window, showing beta particle trajectories and points of emergence of secondary elect from the converter window.
Figure 3B:
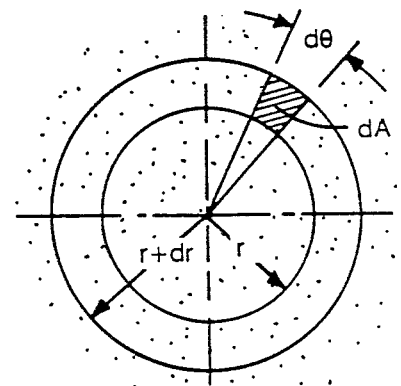
FIG. 3B is a plan view looking up at the exit side of the converter window showing points of emergence of secondary electrons from the converter window.

FIGS. 3A and 3B illustrate how the angle $\theta$ of emission of a beta particle from a point source located at a distance h above a converter window of thickness h determines the radial distance r from the source of an emerging secondary electron. This picture assumes simple straight-line beta trajectories and secondary electron emission at the point of the extrapolated beta particle exit. Although this "geometrical" model of the beta-to-secondary electron conversion is an oversimplification of the process, it turns out that the resolution $R_g$ predicted with this approach is a reasonably accurate estimate. The nomenclature used in FIGS. 3A and 3B is as follows:

r = transverse distance of point of emergence from source position
$\phi$ = azimuthal angle
$\theta$ = polar angle
$\omega$ = solid angle, $d\omega = \sin\theta d\theta d\phi$
dA = area element in emergence plane
dN = number of betas emitted into angle $[\theta, \theta = d\theta]$ and $[\phi, \phi + d\phi]$
n(r) = dN/dA = density of points of emergence in the emergence plane.

For isotropic emission, $dN/d\omega = K$ (constant). Therefore $$dN = Kd\omega,$$
$$= K\sin\theta \, d\theta d\phi,$$
$$= K\sin\theta \, (d\theta/dr) dr \, d\phi$$
$$= K/r \sin\theta \, (d\theta/dr) r \, dr \, d\phi.$$

However $dA = r \, dr \, d\phi$.

Therefore $dN/dA = (d\theta/dr) K \sin\theta / r$.

Since $r = H\tan\theta$ where $H = t + h$, then $dr/d\theta = H/\cos^2\theta$

From simple trigonometric identities, we can then show that
$$n(r) = n_o(1 + r^2/H^2)^{-3/2},$$

where $n_o = K/H^2$. Setting $n(R_g/2) = 1/2 n_o$, where $R_g$ is the FWHM of n(r), and $r > 0$ refers to $\phi \rightarrow \phi + \pi$, yields $R_g = 1.5(t + h)$.

Thus, for a sample thickness of 1 micron, or equivalently the mean height of the source above the converter window being h=0.5 micron, and a converter window of 1 micron, we have $R_g = 2.3$ microns. If the converter window were 0.1 micron, then we would have $R_g = 0.9$ microns, with the specimen thickness being the dominant contributor to $R_g$. The principal factors that have been ignored in this simple geometric resolution estimate are (1) the fact that betas do not travel precisely in straight lines and (2) that the further betas travel through the converter window the less likely they are to reach the exit side of the converter window and produce a secondary electron. Fortunately, these two factors not only individually affect R by small amounts but also tend to result in values which are less than the $R_g$ derived above.

If the betas were regarded in the most extreme case as travelling in isotropically distributed directions after striking the entrance face of the converter window, then R would be a convolution of two geometric resolutions: one being 1.5 h for the FWHM of the radial distribution of betas striking the converter window, and the other being 1.5t as a result of traveling through the foil. Thus the convolution of these two resolutions would be $R = 1.5(h^2 + t^2)^{\frac{1}{2}}$ which is less than the $R_g$ based on the straight-line picture, i.e. $R_g = 1.5(t + h)$. Including attenuation in the model only reduces R also since betas that attempt to emerge further from their point of origin will be more likely to be absorbed. Using the straight-line picture, the effect of attenuation on R would be approximated by weighting the n(r) given above with $\exp(-0.693 L(r)/x_{\frac{1}{2}})$ where L(r) is the distance the beta travels through the foil in order to emerge at r and $x_{\frac{1}{2}}$ is the half-thickness stopping power of the converter window material.

Secondary electrons emerging from the converter window over a 0 to 20 eV energy range usually compromise more than 80% of the converted electron energy distribution with a mean energy of typically 10 eV. E. Rudberg, Phys. Rev. 50, 138 (1936). These relatively low energy electrons can easily be accelerated forward by an applied voltage on an "anode" electrode and then focused by additional electron optical lens elements to form a real image of the original secondary electron emission pattern. The principles of emission microscopy, with the photoemission microscope serving as an illustration, are detailed in G. F. Rempfer and O. H. Griffith, "The Resolution of Photoelectron Microscopes with UV, X-Ray, and Synchrotron Excitation Sources", Ultramicroscopy 27, (1989) 273-300. The optical system is conventional, and thus need not be dealt with in detail herein. Aspects of emission microscopy that are particularly relevant are the aberration limited resolution $R_a$ and the image acquisition procedure.

The relatively large energy spread, 0-20 eV, of secondary electrons precludes values of $R_a$ on the order of 10 nm that can be obtained with a photoemission microscope where the photoemitted electrons have an energy spread typically of 0-1 eV. However submicron aberration limits can be obtained for secondary electron emission microscopy. A worst case scenario can be estimated from equation (14) of G. F. Rempfer and O. H. Griffith, "The Resolution of Photoelectron Microscopes with UV, X-Ray, and Synchrotron Excitation on Sources", Ultramicroscopy 27, (1989) 273-300. Using a value of 10V for Ve (the emission energy in rationalized volt units) and a value of $10^5$V/cm for $V_a/1$ yields $r_{1c} = 0.6$ microns as the apparent emission spot size for 10 eV electrons emitted at 90° from the converter window normal. Here $r_{1c}$ can be regarded as a good approximation to $R_a$.

If, however, we take into account the fortuitous situation that secondary electron emission favors the forward direction with a cosine distribution, then the resolution improves by more than a factor of ten. Setting the emission angle to the 33° average of a cosine distribution in equation (15) of G. F. Rempfer and O. H. Griffith, "The Resolution of Photoelectron Microscopes with UV, X-Ray, and Synchrotron Excitation Sources" Ultramicroscopy, 27, pp. 273-300 (1989) gives
$$r_{1c} = 0.05 \cdot 1 V_e / V_a$$

which is more than 10 times lower than the prediction of equation (14). $V_a/1 = 10^5$V/cm is at the upper limit of field strength that one would choose to operate the microscope so that a reduction of a factor of two for safety would still put the aberration contribution to the IBTM resolution well below 0.5 micron.

The remaining electro-optical considerations regarding the resolution capabilities are image magnification and image "screen" resolution. Detector 22 is a position sensitive detector. The detector is characterized by two quantities, its diameter $D_d$ and its line pair resolution $N_{LP}$. The resulting resolution of the microscope due to the detector line pair resolution is thus $$R_d = \frac{D_d}{M \cdot N_{LP}}$$

where M is the image magnification of the emission microscope optics. Many different position sensitive electron detectors could be used, including the commonly used channel electron multiplier array with resistive anode encoder (CEMA/RAE; available from Quantar Technology Inc., 3004 Mission Street, Santa Cruz, CA 95060 USA). Economical commercially available CEMA/RAE detectors typically have values of 40 mm and 256 for $D_d$ and $N_{LP}$, respectively. Thus M = 156 would yield $R_d = 1$ micron, for example. The corresponding maximum portion of the specimen that would be recorded in a single exposure in this case would be a 256 micron diameter area.

The choice of position sensitive detector (PSD) depends on the desired final resolution and field of view, i.e. the maximum size specimen that can be imaged in a single exposure. For purposes of illustration, a 400 micron field of view can be imaged on a 40 mm diameter PSD with the emission microscope operating at 100X magnification. With a presently available PSD resolution of 40mm/1024=40 microns, this would translate into a detector limited resolution of 0.4 microns. The field of view can be increased at the expense of resolution or with a larger detector (75 mm diameter is the largest size presently available as a standard item).

In any case, the maximum magnification necessary to keep $R_d$ in the submicron range would be less than 1000 X. This magnification is easily obtained with only a single symmetric einzel lens (projector lens 20) in combination with the immersion objective lens 18, in which the converter window acts as the cathode. Such an arrangement would keep the overall length of the microscope below 1 meter. An alternative option for viewing larger specimen areas, using a scanning multiple exposure technique, is described below.

For a less than 1 mm field of view and a 1 micron resolution, the microscope can be operated with the specimen at ground potential and the image detector face at +10 kV. At this voltage the CEMA/REA PSD could be used with the REA signal leads brought out of the vacuum chamber with internal or external decoupling capacitors. For a 5 mm field of view and 1 micron resolution, a maximum accelerating bias of 50 kV would be optimal. In this case a CEMA would still be used for charge amplification of the focused secondary electrons, but the CEMA would be followed by a phosphor screen inside the vacuum. The corresponding light flashes would be positionally encoded outside the vacuum through a viewport or fiberoptic bundle feedthrough using standard vidicon camera techniques or light-sensitive charge coupled device (CCD) arrays. The use of a CEMA in conjunction with a REA or a CCD array are common techniques used in commercially available charge particle PSD and low level light detection systems which enable the accumulation of single events to build-up an acquired image. The histogramming electronics and computer software to display as well as produce a digitally recorded image are also commercially available standard items.

The exposure time T required to obtain an image is intimately related to the desired resolution since there is an effective resolution limit $R_s$ dictated by the tendency of statistical fluctuations in the recorded intensity pattern to give rise to a fuzziness in an otherwise sharp feature in the image. To a good approximation we can use the following expression $$r_s = 6 \left( f_{CW} \cdot a_s \cdot t_s \cdot \frac{T}{2} \right)^{-\frac{1}{2}},$$

where $a_s$ is the volume specific activity of the labeled specimen and $t_s$ is the specimen thickness. This is based on the assumption of unity contrast between beta and no beta emission and the recorded fluctuations being the square root of recorded counts per pixel, i.e., Poisson statistics. G. R. Brandes, K. F. Canter, and A. P. Mills, Jr., Phys. Rev. Lett. 61, 492 (1988). The above expression can be transformed into a more convenient form by substituting typical values of $t_s$ and $a_s$, i.e. 1 micron and 0.04 sec$^{-1}$- micron$^{-3}$, respectively. The $a_s$ value is based on dosing of biological materials at specific activities of 1 microCurie per microgram. We thus obtain the rule-of-thumb relation $$T = \frac{0.5 \text{ hr}}{R_s^2 \cdot 2f_{CW}}$$

where $R_s$ is in units of microns. Given the range of 0.01 to 0.10 for $f_{cw}$ and 1 to 5 microns for $R_s$, it is seen that T can range from 15 minutes to 2 days per exposure. In some applications, shorter exposure times would be sufficient when it is only necessary to make a quantitative analysis of the changes in the isotope spatial distribution.

OTHER EMBODIMENTS

Many other embodiments are within the following claims.

For example, other types of converter windows than those specifically described may be used.

Figure 4:
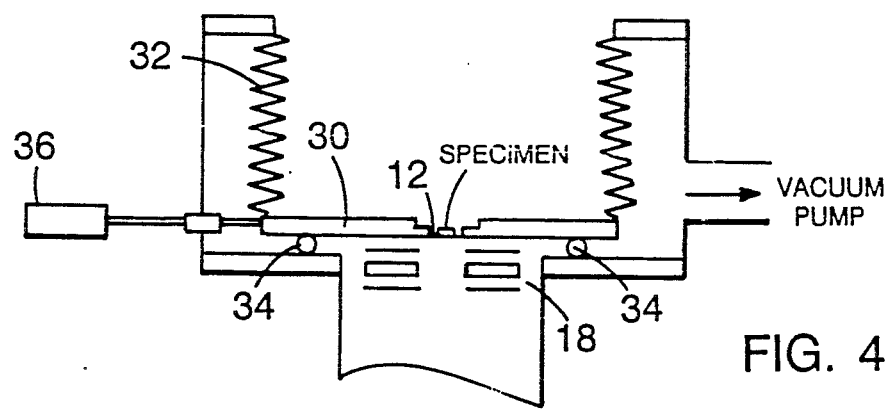
FIG. 4 is a cross-sectional, diagrammatic view of an alternative embodiment of the invention.

Also, in some applications it may be desirable to use a specimen or an array of specimens whose dimensions exceed the field of view for the microscope operating in a high magnification mode. In this situation the converter window could be supported with a high transmission, e.g., 90%, mesh (made from tungsten, nickel, stainless steel, or other high strength metals) to permit it to support a relatively large (e.g., from several mm to a few cm) specimen. As shown in FIG. 4, the specimen and converter window 12 are supported on a sliding stage 30, to allow the position of the specimen to be moved transversely relative to the axis of the microscope. An electron-beam-welded bellows 32, differentially-pumped, conventional sliding seal 34 (Teflon or Kelrez), and linear actuator 36 serve to move stage 30 back and forth while the vacuum inside the microscope is maintained. The bellows and seal could be eliminated if the specimen and converter window are enclosed within an evacuated chamber; stepping motors (commercially available electromechanical or piezoelectric) positioned inside the evacuated chamber could be used to translate the specimen. By suitably moving the specimen stage, either manually or under automated control, it is possible to bring all portions of the specimen within the field of view of the microscope optics. A montage made up of several exposures at various specimen stage positions would then comprise an image of the entire specimen or specimen array.

I claim:

1. Apparatus for microscopic imaging of beta emissions from a beta-emitting specimen, comprising
   a converter window on which the specimen is supported, the converter window being constructed of a material and configured so that beta particles emitted by cause secondary electrons to be emitted from the opposite surface of the window; and
   an emission microscope configured to accept the secondary electrons emitted by the converter window and to image them at an imaging location.

2. The apparatus of claim 1 wherein the specimen is supported in proximity to the converter window.

3. The apparatus of claim 2 wherein the specimen is supported directly on one surface of the converter window.

4. The apparatus of claim 2 further comprising a position-sensitive detector located at the imaging location.

5. The apparatus of claim 2 further comprising a support grid underlying and supporting the converter window.

6. The apparatus of claim 2 wherein the converter window is exposed to the vacuum of the emission microscope on one side and to a non-evacuated space on the other side.

7. The apparatus of claim 6 wherein the thickness of the converter window is less than 10 microns.

8. The apparatus of claim 7 wherein the thickness of the converter window is greater than 1 micron.

9. The apparatus of claim 2 further comprising a vacuum enclosure surrounding the converter window so that the window has a vacuum on both sides 10. The apparatus of claim 9 wherein the thickness of the converter window is less than 1 micron.

11. The apparatus of claim 10 wherein the thickness of the converter window is less than 0.1 micron.

12. The apparatus of claim 11 wherein the thickness of the converter window is greater than 0.05 microns.

13. The apparatus of claim 6 wherein the converter window is a multilayer structure comprising a first layer capable of moderating beta particles to facilitate secondary electron emission and a second layer adhered to the first layer and serving to prevent gas leakage through said window from the unevacuated side to the evacuated side.

14. The apparatus of claim 13 wherein the second layer comprises a polymerized film.

15. The apparatus of claim 2 wherein said converter window comprises a polycrystalline material for converting beta particles to secondary electrons.

16. The apparatus of claim 15 wherein said polycrystalline material is titanium

17. The apparatus of claim 6 further comprising a support grid underlying and supporting the converter window.

18. The apparatus of claim 17 wherein said converter window comprises a titanium layer and said support grid comprises a titanium mesh.

19. The apparatus of claim 2 further comprising means for transversely translating the specimen and converter window relative to the detector.

20. A method for observing and detecting the spatial distribution of beta emissions from a specimen treated with beta-emitting isotopes, comprising the steps of:

supporting the specimen in proximity to a converter window, the converter window being constructed of a material and configured so that beta particles emitted by the specimen enter one surface of the converter window and cause secondary electrons to be emitted from the opposite surface of the window; and microscopically imaging the secondary electrons at an image location using an emission microscope.

21. The method of claim 20 further comprising the step of observing the spatial distribution of the detected secondary electrons.

22. The method of claim 20 wherein the beta-emitting isotope is tritium.

23. The method of claim 20 further comprising the step of making quantitative measurements of the spatial distribution of electrons emitted by the converter window.

* * * * *

UNITED STATES PATENT AND TRADEMARK OFFICE
CERTIFICATE OF CORRECTION

PATENT NO.   : 5,130,539

DATED        : July 14, 1992

INVENTOR(S)  : Karl F. Canter

It is certified that error appears in the above-identified patent and that said Letters Patent is hereby corrected as shown below:

On title page, item [56]

Under OTHER PUBLICATIONS, col. 2 "Walter" should be --Malter--.

Col. 2, line 62, after "wire", insert --mesh (50 lines/inch, 0.001 inch wire thickness), chemically--.

Col. 4, line 17, "MeV-cm$^2$" should be --MeV-cm$^2$/g--.

Col. 4, line 19, after "for", delete "t".

Col. 4, line 43, after "maximum", insert --(FWHM) of a slice through the center of the image--.

Col. 4, line 46, "thickness h" should be --thickness t--.

Col. 4, line 63, "[θ,θ=dθ]" should be --[θ,θ+dθ]--.

Col. 5, line 19, ">" should be --<--.

Col. 8, line 1, after "on", insert --typical--.

UNITED STATES PATENT AND TRADEMARK OFFICE
CERTIFICATE OF CORRECTION

PATENT NO. : 5,130,539  
DATED : July 14, 1992  
INVENTOR(S) : Karl F. Canter

Page 2 of 2

It is certified that error appears in the above-indentified patent and that said Letters Patent is hereby corrected as shown below:

Col. 8, line 56, after "by", insert --the specimen enter one surface of the converter window and--.

Signed and Sealed this

Fifth Day of October, 1993

Attest:

BRUCE LEHMAN

Attesting Officer

Commissioner of Patents and Trademarks